Oct. 23, 1962 R. B. HEIART 3,060,026
PHOTOPOLYMERIZATION PROCESS OF IMAGE REPRODUCTION
Filed Jan. 9, 1961
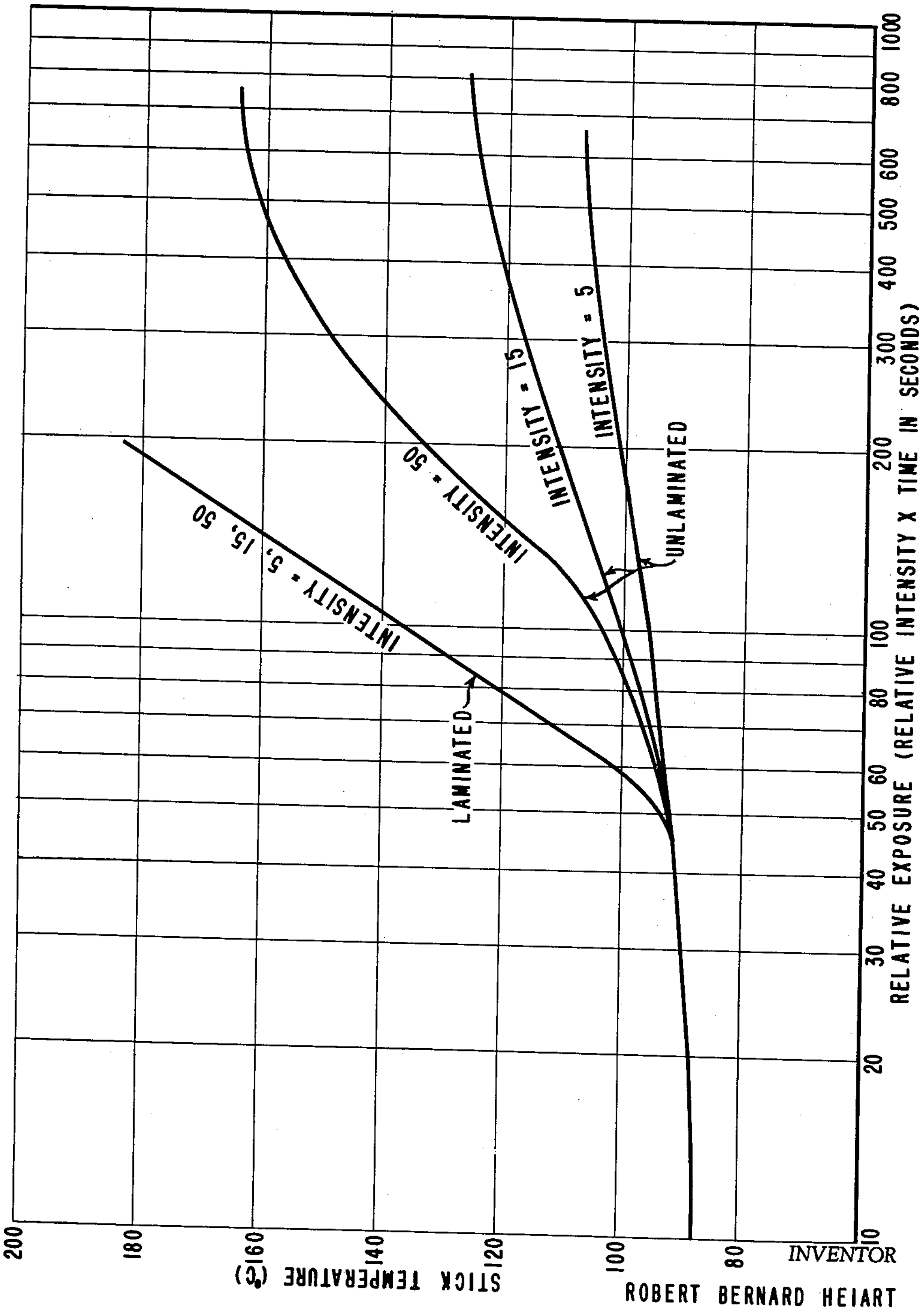
INVENTOR
ROBERT BERNARD HEIART
BY *Weston B. Wardell Jr.*
ATTORNEY

3,060,026
PHOTOPOLYMERIZATION PROCESS OF IMAGE REPRODUCTION

Robert Bernard Heiart, Middletown, N.J., assignor to E. I. du Pont de Nemours and Company, Wilmington, Del., a corporation of Delaware Filed Jan. 9, 1961, Ser. No. 81,377
8 Claims. (Cl. 96—28)

This invention relates to processes of image reproduction. More particularly, it relates to processes wherein images are formed by photopolymerization techniques. Still more particularly, it relates to improved processes wherein the underexposed complementary image areas are transferred to an image-receptive support.

Various processes for producing copies of an image embodying thermal transfer are known. In one of the commercially promising processes, the thermal transfer is accomplished in a wet system or one where water-yielding materials are present in addition to light-sensitive materials. In assignee's Burg and Cohen applications Serial No. 831,700, filed August 5, 1959, Serial No. 839,304, filed September 11, 1959, and Serial No. 850,522, filed November 3, 1959, dry processes are described for forming images by photopolymerization. These processes, however, like other addition-polymerization reactions, are inhibited by oxygen in the air. To overcome the effect of oxygen and to obtain satisfactory results, it is necessary to expose the photopolymerizable elements to a relatively high intensity source of actinic radiation and/or expose the elements in a vacuum printing frame.

An object of this invention is to provide new and more practical processes for forming images by photopolymerization. Another object is to provide such processes which are simple and dependable. A further object is to provide such processes which utilize simple and economical apparatus. A still further object is to provide such processes which involve exposure of a photopolymerizable thermoplastic composition to actinic radiation to form an image of higher softening temperature in the exposed areas than in the underexposed areas, heating the underexposed areas to an operating temperature and transferring the underexposed areas. An additional object is to provide a process which gives excellent results with conventional exposure at normal atmospheric conditions with relatively low intensity illumination. Still further objects will be apparent from the following description of the invention.

The above objects are accomplished in the image reproduction processes of this invention which in their broader aspects comprise exposing imagewise with actinic radiation a photopolymerizable element bearing a stratum of a photopolymerizable composition and in intimate contact with said stratum at least during the exposure a removable cover sheet capable of uniformly transmitting actinic radiation and having low permeability to oxygen, said stratum being solid below 40° C., being thermally transferable by having a stick temperature above 40° C. and below 220° C. and comprising (*a*) a thermoplastic polymeric compound solid at 50° C., (*b*) a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization and having a plasticizing action on said thermoplastic compound, constituents (*a*) and (*b*) being present in from 3 to 97 and 97 to 3 parts by weight, respectively, until polymerization, with an accompanying increase in stick temperature, of said unsaturated compound takes place in the exposed areas without substantial polymerization and an increase in stick temperature in the underexposed, complementary, adjoining coplanar image areas and removing the cover sheet. Subsequently, the surface of the exposed stratum may be brought into contact with the image-receptive surface of a separate element, while heating at least one of the contacting elements to an operating temperature intermediate between the stick temperatures of the underexposed and exposed areas and then separating the two surfaces, whereby an image corresponding to the underexposed image areas is transferred to the surface of the separate element. Alternatively, a useful article may be obtained without involving the transfer to a receptive surface, as is illustrated in Examples VIII and IX below.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature," as applied to either an underexposed or exposed area of a photopolymerizable stratum, means the minimum temperature at which the image area in question sticks or adheres (transfers), within 5 seconds, under slight pressure, e.g., thumb pressure, to analytical paper (Schleicher & Schull analytical filter paper No. 595) and remains adhered in a layer of at least detectable thickness after separation of the analytical paper from the stratum. The term "operating temperature" means the temperature at which the operation of transferring the image from the photopolymerizable stratum to the image-receptive surface is actually carried out. The operating temperature is intermediate between the "stick" temperatures of the underexposed and exposed areas of a photopolymerizable stratum.

In general, in the process, components (*a*) and (*b*) are present in amounts from 10 to 95 and 90 to 5 parts by weight, respectively. Also, the compositions are such that they do not soften at temperatures below 40° C. and do not undergo any essential change in softening temperature by holding for up to 15 seconds at the original softening temperature of the composition.

In a preferred photopolymerizable composition, a free-radical generating addition polymerization initiator is present in the photopolymerizable composition preferably in amounts ranging from 0.001 to 10.0 parts by weight per 100 parts by weight of components (*a*) and (*b*). The preferred photopolymerizable composition can also contain 0.001 to 2.0 parts by weight per 100 parts by weight of components (*a*) and (*b*) of a thermal addition polymerization inhibitor.

It has been found that improvement over previous thermal transfer process is obtained where the photopolymerizable stratum has in intimate contact with it, at least during exposure, a removable cover sheet capable of uniformly transmitting actinic radiation and having a low permeability rate to oxygen. A film sheet of polyethylene terephthalate makes a suitable removable cover sheet. Other covering materials will be hereinafter described.

The foregoing thermoplastic, image-bearing elements can be made by exposing to actinic radiation, imagewise, a stratum having the constitution defined above and having thereon at least during exposure a removable cover sheet. Sufficient exposure is given until substantial addition polymerization takes place in the exposed areas to form an addition polymer and significantly less polymerization takes place in the underexposed areas. The exposure can be through a stencil, or a line or halftone negative or positive, or by projection exposure. Alternatively, reflectographic exposure techniques may also be employed.

While the addition polymerizable component present in the underexposed areas of the photopolymerizable element can be any monomeric ethylenically unsaturated compound capable of polymerizing or forming a high polymer in a short time by photoinitiated addition polymerization as disclosed in Plambeck U.S. 2,760,863, the particularly useful compounds fall within a general class, namely, normally non-gaseous (i.e., at 20° C. and atmospheric pressure) ethylenically unsaturated monomeric compounds having one to four terminal ethylenic groups, preferably two, a normal boiling point above 100° C., and a plasticizing action on the thermoplastic polymer. Preferably, the monomeric compounds have a molecular weight of not more than 1500.

In practicing a preferred embodiment of the invention, a photopolymerizable element containing an image-yielding stratum of the above components is laminated to a removable cover sheet capable of uniformly transmitting actinic radiation and having a low permeability to oxygen by contacting the surfaces of the cover sheet and the image-yielding stratum and, if necessary, applying heat while the surfaces are pressed together. The laminated element is exposed to actinic radiation reflectographically to a reflective surface bearing a light absorbing message or through a photographic process transparency, e.g., a photographic positive, negative, halftone, or a light-transmitting paper, and, after the exposure, while the interface is below the operating temperature, the cover sheet is removed. The exposed image-yielding stratum is then brought into intimate contact under pressure with the surface of an image-receptive support, e.g., paper, metal, synthetic polymer, screen, etc., during which time the element is heated to the operating temperature, e.g., a temperature in the range of 40° to 220° C. or more, and, while still warm, the surfaces are separated. The thermoplastic photopolymerizable composition is transferred to the paper, metal, etc., support in the areas corresponding to the underexposed thermally transferable areas to give at least one copy of the original image. Multiple copies can be obtained by repeating the heat transfer procedure using appropriate coating thicknesses of the photosensitive layer, pressures and temperatures to give the desired number of copies.

The invention is also useful for alternate methods of image reproduction such as are described in assignee's Burg and Cohen U.S. applications, Serial Nos. 839,304, filed September 11, 1959, and 850,522, filed November 3, 1959. In practice, the exposed photopolymerized stratum, after removal of the cover sheet, can be dusted with finely divided solid materials such as pigments, powders, dyes, thermographic materials, etc., and the non-adhering particles removed. The materials adhere only to the unexposed image areas and can be used to make single or multiple copies of the original image transparency and for other purposes. The above-described exposed photopolymerized element also can be brought into contact with a separate layer containing finely divided discrete particles which are loosely bound in said layer. Upon heating one or both surfaces to an operating temperature of at least 40° C. and separating the surfaces, the discrete particles are transferred to the underexposed areas of the photopolymerized element. The discrete particles can then be transferred to an image-receptive support, e.g., a sheet of paper, by heating to the operating temperature while the layer containing the discrete particles is in contact with the image-receptive support. Multiple copies can be obtained by repeating the heat transfer procedure. Examples VIII and IX illustrate one aspect of each of the above-described alternate processes.

Suitable thermoplastic polymers for component (*a*) include:

(A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methylacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3 polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formal;

(N) Polyformaldehydes;

(O) Polyurethanes;

(P) Polycarbonates;

(Q) Polystyrenes.

To the thermoplastic polymer constituent of the photopolymerizable composition there can be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamineformaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the composition, reducing tack and in addition, as coloring agents.

Suitable free-radical initiated, chain-propagating addition polymerizable ethylenically unsaturated compounds for use as components (*b*) which can be used with the above-described thermoplastic polymer compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney, U.S. Patent 2,927,022, issued March 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like; unsaturated amides, particularly those of the alpha-methylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(gamma - methacrylamidopropoxy) ethane beta-methacrylamidoethyl methacrylate, N-(beta-hydroxyethyl) - beta - (methacrylamido)ethyl acrylate and N,N-bis(beta-methacrylyloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. The amount of monomer added varies with the particular thermoplastic polymer used.

A preferred class of free-radical generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethyl-anthraquinone, 2-tert-butylanthraquinone, octamethylanthraquinone, 1,4-naphthoquinone, 9,10-phenanthrenequinone, 1,2-benzanthraquinone, 2,3-benzathraquinone, 2-methyl-1,4-naphthoquinone, 2,3-dichloronaphthoquinone, 1,4-dimethylanthraquinone, 2,3 - dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione. Other photoinitiators which are also useful, even though some may be thermally active at temperatures as low as 85° C., are described in Plambeck U.S. Patent 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil, and thiazine dyes, e.g. Thionine Blue G (C.I. 52025), Methylene Blue B (C.I. 52015) and Toluidine Blue O (C.I. 52040).

Various dyes, pigments, thermographic compounds and color forming components can be added to the photopolymerizable compositions to give varied results after the thermal transfer. These additive materials, however, preferably should not absorb excessive amounts of radiation at the exposure wave length or inhibit the polymerization reaction.

Among the dyes useful in the invention are Fuchsine (C.I. 42510), Auramine Base (C.I. 41000B), Calcocid Green S (C.I. 44090), Para Magenta (C.I. 42500), Tryparosan (C.I. 42505), New Magenta (C.I. 42520), Acid Violet RRL (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), and Ethyl Violet (C.I. 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent nonphotosensitive layer.

Useful thermographic additives, e.g., 3 cyano-4,5-dimethyl-5-hydroxy-3-pyrrolin-2-one are disclosed in Howard, U.S. 2,950,987. Such compounds, in the presence of activators, e.g., copper acetate, are disclosed in assignee's Belgian Patent 588,328. Other useful thermographic additives are disclosed in the following U.S. Patents: 2,625,-494, 2,637,657, 2,663,654, 2,663,655, 2,663,656, and 2,663,657.

Suitable color-forming components which form colored compounds on the application of heat or when brought in contact with other color-forming components on a separate support include, (1) Organic and inorganic components: dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) Inorganic components: ferric salts and potassium thiocyanate; ferrous salts and potassium ferricyanide; copper or silver salts and sulfide ions; lead acetate and sodium sulfide.

(3) Organic components: 2,4-dinitrophenylhydrazine and aldehydes or ketones; diazonium salt and phenol or naphthol, e.g., benzene diazonium·chloride and β-naphthol; p-dimethylaminobenzaldehyde and p-diethylamino-aniline.

The photopolymerizable composition is preferably coated on a base support. Suitable support materials are stable at the operating temperaures used in the instant invention. Suitable bases or supports include those disclosed in U.S. Patent 2,70,863, glass, wood, paper (including waxed or transparentized paper), cloth, cellulose esters, e.g., cellulose acetate, cellulose propionate, cellulose butyrate, etc., and other plastic compositions such as polyamides, polyesters, etc. The support may have in or on its surface and beneath the photopolymerizable stratum an antihalation layer as disclosed in said patent or other substrata needed to facilitate anchorage to the base.

The image receptive support to which the image is transferred must also be stable at the operating temperatures. The particular support used is dependent on the desired use for the transferred image and on the adhesion of the image to the base. Suitable supports include paper including bond paper, resin and clay sized paper, resin coated or impregnated paper, cardboard, metal sheets, foils and meshes e.g., aluminum, copper, steel, bronze, etc.; wood, glass, nylon, rubber, polyethylene, linear condensation polymers such as the polyesters, e.g., polyethylene terephthalate, regenerated cellulose, cellulose esters, e.g., cellulose acetate, silk, cotton and viscose rayon fabrics or screens.

As previously mentioned, the receptive support may have a hydrophilic surface or may contain on its surface chemical compounds which react with compounds being transferred so as to produce differences in color, hydrophilicity or conductivity between the exposed and underexposed areas or for improved adhesion or brightening of the receptive support. The image-receptive surface may be smooth, contain roughening agents such as silica, be perforated or be in the form of a mesh or screen.

Prior to the transfer of a portion of the photopolymerizable layer in the underexposed areas, the layer, protected by the cover sheet, is exposed to actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive.) The image or transparency may or may not be in operative contact with the protective cover sheet, e.g., contact exposure or projection exposure. It is possible to expose through paper or other light transmitting materials. A stronger radiation source or longer exposure times must be used, however.

Reflex exposure techniques are especially useful in the present invention, particularly when office copies are made. By using reflex exposure, copies can be made from materials having messages on both sides of a page or from opaque supports, e.g., paper, cardboard, metal, etc., as well as from poor light transmitting surfaces with no loss in speed, excellent resolution, and in addition, right reading copies are obtained directly on transfer.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sunlamp type, and the fluorescent sunlamps, are most suitable. The sunlamp mercury-vapor arcs are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

After the exposure of the photopolymerizable layer and removal of the cover sheet, the exposed composition is brought into intimate contact with the support while heat may be simultaneously applied to effect the transfer of the underexposed areas of the photopolymerizable composition. While the heat is preferably applied simultaneously with the contact of the exposed element to the receptive support, the heat can be applied at any stage of the process prior to the separation step to either or both elements provided the operating temperatures are intermediate between the stick temperatures of the underexposed and exposed areas of the photopolymerizable stratum. Heat can be applied by means well known to the art, e.g., rollers, flat or curved heating surfaces or platens, radiant sources, e.g., heating lamps, etc.

The operating temperature can range from above 40° C. to 220° C. or more and the contact time for 0.1 to 10 seconds. In general about 0.1 second is adequate and shorter periods of contact are possible by using an intense radiant source of heat, e.g., infrared lamps or heat sources. The preferred operating temperature range is 55° C. to 120° C.

Lamination of the cover sheet to the photopolymerizable stratum may occur at the time of manufacture of the element, immediately prior to exposure, or anytime therebetween. Lamination is effected most easily when the photopolymerizable stratum is coated on a flexible support and when the cover sheet is also flexible. In such a case the cover sheet can be laid over the surface of the photopolymerizable element and the two elements laminated by passing between pairs of rollers. Satisfactory results are obtained, however, when either or both the cover sheet and the support for the photopolymerizable stratum are of a non-flexible material, e.g., glass. In the case of a glass cover sheet, a parting layer should be used between the cover sheet and the photopolymerizable layer. With a non-flexible element, some other means of applying a uniform pressure may be required such as a single, hand-operated roller.

When the stratum is relatively soft, satisfactory lamination can be effected at room temperature; when the stratum is harder, it is preferable to apply heat as well as pressure. Heat may be applied up to temperatures approaching the softening point of the stratum. The pressure is not particularly critical; it should be sufficient to bring about good contact between the surfaces to be laminated but not sufficient to damage the material. Since it is only required that there be good contact during the time of exposure (so as to keep atmospheric oxygen away from the photopolymerizable stratum) it is possible to place a thin layer of liquid, e.g., a silicone liquid, between the two surfaces in which case good contact is obtained with a minimum pressure.

The cover sheet may be of any material which uniformly permits the passage of actinic radiation and which prevents or substantially retards the passage of oxygen. A high degree of transparency to actinic radiation and a low degree of permeability to oxygen provide the most desirable combination of properties, resulting in a laminated element of maximum sensitivity to the radiation. Suitable materials for the cover sheet are transparent films, such as regenerated cellulose, cellulose esters, e.g., cellulose acetate, cellulose propionate, etc., polyesters, e.g., polyethylene terephthalate, polypropylene terephthalate, polyethylene terephthalate-isophthalate copolymer, polycarbonate, etc.; polyethylene; polypropylene; saran; polyacrylonitrile; polyvinyl alcohol, etc.; rigid materials, e.g., glass, polyacrylic acid esters, e.g., polymethyl acrylate and polyethylmethacrylate; transparent or translucent papers, e.g., tracing paper, wax paper, glassine, etc. The cover sheet may be used to add additional information to the image that is to be transferred, e.g., graphs and other detail. The cover sheet may also be colored but must be capable of transmitting radiation of the wave length to which the photopolymerizable element is sensitive.

The photopolymerizable element, as will be noted in the examples to follow, comprises a support which has low permeability to atmospheric oxygen. Therefore it is only the surface of the photopolymerizable stratum opposite the support which requires protection from the influx of oxygen.

The invention will be further illustrated by, but is not intended to be limited to, the following detailed examples.

*Example I*

The following solution was prepared:

1.000 g. polyethylene glycol diacrylate
0.010 g. Calcocid Green S Dye (C.I. 44090)
0.008 g. phenanthrenequinone (photoinitiator)
1.000 g. cellulose acetate butyrate
Acetone to bring solution weight to 20.0 g.

The cellulose acetate butyrate contained ca. 13% acetyl groups, ca. 37% butryl groups and had a viscosity of 64 to 124 poises as determined by A.S.T.M. method D-871-54T in solution described as Formula A, A.S.T.M. method D-871-54T. The polyethylene glycol diacrylate was derived from polyethylene glycol with an average molecular weight of 300.

The solution was coated to a depth of 2.5 mils on a 1.5-mil thick polyethylene terephthalate film support. The coating was dried and there resulted a 0.5-mil thick photopolymerizable layer which was tacky to the touch but which could not be transferred at room temperature.

One half of this coating was laminated to a second sheet of a 1.5-mil polyethylene terephthalate film support by laying the second cover film on the coating and passing the sandwich so formed through rollers heated to 130° C. and pressed together with a force of 2 pounds per inch of roller length.

Portions of both the laminated and the unlaminated coatings were exposed through a transparency bearing a line image to a GE Type RS–275 watt Sunlamp for 3 and 5 seconds at a distance of 3 inches from the lamp. The cover films were then stripped from the laminated coatings.

Transfers of images to paper were made by laying a sheet of bond paper onto the coating and passing the superposed elements through pressure rollers at 130° C. and 2½ pounds of force per lineal inch of the rollers. The paper was separated from the film as it emerged from the rollers. Clear, sharp positive images were produced by the laminated samples having both the 3 and 5 seconds' exposure while the unlaminated samples totally transferred to the receptive paper.

*Example II*

Example I was repeated through the lamination and exposure steps except that the polyester film used as the cover sheet during exposure was replaced by (*a*) 1.0-mil untreated regenerated cellulose, (*b*) a glass plate 1/16 inch thick, (*c*) glassine paper, (*d*) onion skin paper, (*e*) a single-ply, unsized, paper facial cleansing tissue weighing approximately 15.7 grams per square meter, and (*f*) a tightly-woven cloth (about 125 threads per inch) of acrylic synthetic fiber. Cover sheets (*a*), (*b*) and (*c*) were stripped off and transfers of images to paper were made as described in Example I. With cover sheets (*d*), (*e*) and (*f*), however, the adhesion between the cover sheet and the photopolymerizable stratum was greater than the adhesion between the polyethylene terephthalate film support and the photopolymerizable stratum. Therefore, upon stripping, the photopolymerizable stratum separated from the original support and remained adhered to cover sheets (*d*), (*e*) and (*f*). After stripping, the images were transferred to paper as described in Example I. Sharp positive images were obtained with cover sheets (*a*), (*b*), (*c*) and (*d*) since these four transparent cover sheets possess sufficiently low permeability to oxygen to substantially reduce the oxygen inhibition effect. Quality of the transferred image, where cover sheet (*e*) had been used during exposure, was satisfactory but quality of the image where cover sheet (*f*) had been used was poor (only slightly better than the control wherein no cover sheet was employed). As can be seen, cover films which would ordinarily be considered relatively permeable to gases (e.g. onion skin paper) are adequate for use in the present application. Of course, the lower the permeability of the cover film to oxygen the better will be the results.

*Example III*

The following solution was prepared:

35.000 g. cellulose acetate butyrate
0.700 g. phenanthrenequinone
0.450 g. Calcocid Green Dye (C.I. 44090)
35.000 g. polyethylene glycol diacrylate
0.035 g. p-methoxyphenol
Acetone to make 350 g. of solution The cellulose acetate butyrate contained ca. 20.5% acetyl groups, ca. 26% butyryl groups and had a viscosity of 56 to 131 poises determined by A.S.T.M. method D–1343–54T in solution described as Formula A, A.S.T.M. method D–871–54T. The polyethylene glycol diacrylate was derived from polyethylene glycol with an average molecular weight of 300.

The solution was coated onto a 1-mil thick polyethylene terephthalate film and dried for 20 minutes to give a coating having a thickness of 1.3 mils. After the drying period, a cover film of 1-mil thick polyethylene terephthalate film was applied to half of the coating by laying it on top of the coating and pressing it into intimate contact with a rubber squeegee.

Exposures of the laminated and unlaminated coatings were made to a 400 watt mercury arc lamp General Electric Co. Type H 400–R1. Intensity of the exposing light was varied by altering the lamp to film distance. Relative intensities, as measured by a photovoltaic meter, of 5, 15 and 50 units were employed for different times.

The "stick temperatures" or the minimum temperatures at which thermal transfer of the variously exposed samples occurs were determined (after removing the cover films) as follows. A piece of bond paper was laid on the exposed coating to form a sandwich. This sandwich was placed on a heated copper bar, film side down and pressed against the bar for 5 seconds with a No. 3 cork stopper under moderate thumb pressure. (The pressure is not critical.) The sandwich was then immediately removed from the bar and stripped apart. The minimum temperature at which the coating would transfer from the film to the paper is designated the "stick temperature."

"Stick temperatures" are plotted against relative exposure (relative intensity × time in seconds) on a log scale in the attached drawing. The curves representing the three different intensities of exposure for the laminated element were nearly identical and are shown as a single curve. It can be seen that lamination produces an increase both in sensitivity to radiation and in extent of polymerization as indicated by the increased stick temperature. Furthermore, in the unlaminated case, there is a severe dependence of stick temperature on radiation intensity at constant exposure requiring the use of high intensity for significant polymerization. There is no such "reciprocity" failure in the laminated case. Hence, lower light intensities can be used in exposing the laminated element.

*Example IV*

A thermoplastic photopolymerizable composition was prepared by ball-milling for 2 hours 30 g. of a solution of polyethylene terephthalate/sebacate (50 mole percent) in methylene chloride (18% by weight solids), 5.4 g. of triethylene glycol diacrylate, 0.005 g. of a photoinitiator, anthraquinone, and 0.005 g. of a polymerization inhibitor, p-methoxyphenol. To the photopolymerizable composition was added 0.2 g. of a red dye, 1,1′-diethyl-2,2′-cyanine iodide. The photopolymerizable solution containing the dye was coated to a depth of 10 mils on a 4-mil thick polyethylene terephthalate film support bearing a subcoat of a copolymer of vinylidene chloride/methyl acrylate/itaconic acid as disclosed in Alles et al., U.S. Patent 2,627,088. The coating was dried and a 2-mil thick photopolymerizable layer resulted. The dry surface of half of said coating was brought into contact with a 1-mil thick regenerated cellulose film and passed through pressure rolls heated to 95° C., thereby laminating the regenerated cellulose to the surface of the photopolymerizable coating. Both the laminated and the unlaminated elements were brought into contact with a photographic positive transparency containing line and letter text images and were exposed through the positive for 40 seconds to a 275-watt, low pressure mercury arc lamp at a distance of 4 inches whereby polymerization took place in the areas of the layer which were exposed to light.

The cover film was stripped from the exposed laminated element, after which the element was brought into intimate contact with a sheet of white paper. The resulting sandwich was heated by means of a hot flat heating element pressing against the reverse surface of the polyethylene terephthalate film support at a temperature of 100° C. for 3 seconds. While still warm the two surfaces were stripped apart. The unexposed, dyed thermoplastic, photopolymerizable material transferred from its original support to the paper forming a well-defined, high contrast copy of the original image on the paper and leaving a reverse negative letter text, in relief, on the original support. At room temperature, the new image was non-tacky and firm. Multiple copies were obtained by repeating the thermal transfer process described above using new paper sheets.

The transfer operation was repeated with the film which was exposed without a cover film. The positive image produced was barely readable and a severe background stain covered the entire surface of the paper.

*Example V*

A thermoplastic photopolymerizable composition prepared by mixing 8 g. of low viscosity polyvinyl acetate acrylate (containing a maximum of 10 mol percent acrylyl groups) in 10 ml. of methylene chloride, 1.6 g. triethylene glycol diacrylate, 0.002 g. of anthraquinone and 0.002 g. of p-methoxyphenol, and Fuchsine dye (C.I. 42510) dissolved in ethanol to impart a magenta color to the film (optical density of the coated support equals 0.9 at 565 mμ), was coated on a 1-mil polyethylene terephthalate film. The dry surface of the photopolymerizable layer, 2.8 mils thick, was brought into contact, at room temperature, with a 1-mil thick polyethylene terephthalate film and laminated by pressure from a rubber squeegee. The sandwich was then brought into contact with a photographic positive transparency containing line and letter text images and then placed in a printing frame. The printing frame containing the photopolymerizable element was placed beneath an 1800-watt high-pressure mercury arc and was exposed for 20 seconds to 1.75 watts of actinic radiation per square inch. After removing the exposed element from the printing frame, the cover film was removed and it was brought into intimate contact for 0.5 second with a sheet of white paper which had been preheated to 85° C., and, while warm, the two supports were separated. The unexposed, dyed, thermoplastic photopolymerizable material was transferred to the surface of the paper to provide a direct copy of the original letter text positive. The quality was comparable to that described in Example IV. At room temperature, the transferred image was non-tacky. By repeating the thermal transfer process five times, satisfactory direct copies of the original images were obtained on five paper sheets.

The exposure and transfer operations were repeated except that the cover-film was removed prior to exposure in the printing frame. Total transfer of the polymerizable layer to the paper took place, indicating that the element had been badly underexposed.

*Example VI*

A thermoplastic, photopolymerizable composition was prepared from 19 g. of an aqueous solution of polyethylene oxide having a molecular weight of at least 100,000 (10% solids by weight), 1.9 g. of polyethylene glycol diacrylate (made from a mixture of polyethylene glycols having an average molecular weight of about 300), 0.002 g. of anthraquinone, 0.002 g. of p-methoxyphenol and 0.5 g. of lead acetate dissolved in 2 ml. of water. The composition solution was cast to a thickness of 10 mils on a 1-mil polyethylene terephthalate film. After air drying in the absence of light, a 1-mil thick, dry photopolymerizable layer was obtained on the support. The layer was exposed through a photographic positive transparency containing line and letter text images to 1.75 watts of actinic radiation per square inch for 5 seconds as described in Example II. The exposed surface was brought into intimate contact with the dry surface of a sheet of white paper which had been saturated with an ethanol solution of thioacetamide (20% solids). The resulting sandwich was heated to 60° C. for 10 seconds through the reverse side of the film support as described in Example IV. The photopolymerizable material uniformly transferred to the paper sheet giving a useless copy.

The exposure and transfer operations were repeated except that a 1-mil thick polyethylene terephthalate cover sheet was laminated to the photopolymerizable layer before exposure by passing the two through pressure rollers, and the cover sheet was removed after exposure but before transfer. In this experiment the unexposed material transferred to the paper and a brown-black image corresponding to the original was formed.

*Example VII*

A thermoplastic photopolymerizable composition was prepared from 12 g. of low viscosity polyvinyl acetate methacrylate (containing a maximum of 20 mole percent of methacrylyl groups), 12 ml. of ethanol, 2.54 g. of a polyethylene glycol diacrylate of the type described in Example VI, 0.009 g. of anthraquinone and 0.009 g. of p-methoxyphenol. To a one-third portion of the photopolymerizable composition was added 0.06 g. of a blue-green dye, Calcocid Green S (C.I. 44090), in 4 ml. of ethanol. The resulting dye-containing photopolymerizable solution was cast to a wet thickness of 1 mil on a 1-mil polyethylene terephthalate film support and the layer was allowed to dry in the dark. A firm, dry layer, 0.5 mil thick was obtained. An exposure was given as in Example VI. The exposed, coated surface was then brought into contact with a sheet of white paper, the assembly was passed through rollers which were heated to 85° C. and the paper separated from the film as they emerged. The time of heated contact was about ½ second. The photopolymerizable material uniformly transferred to the paper giving a useless copy.

A new coating was prepared and allowed to dry 10 minutes in the dark. A 1-mil thick polyethylene terephthalate film was laminated to this coating at room temperature by passing it, in contact with the photopolymerizable surface, through pressure rollers. Exposure was made as described above in this example, and the cover film was stripped off and the transfer operation carried out also as described above. A well defined, high-contrast positive reproduction of the original was formed on the paper sheet.

*Example VIII*

A photopolymerizable solution was prepared by mixing 30 grams of an aqueous solution of low viscosity, polyethylene oxide (average molecular weight of 100,000) (5.6% by weight) and 1.7 grams of polyethylene glycol diacrylate (average molecular weight of diol precursor is 300) containing 0.002 gram of anthraquinone as a photoinitiator, and 0.002 gram of p-methoxyphenol as a thermal stabilizer. The solution was coated to a thickness of 20 mils on the surface of a sheet 4 mils in thickness of polyethylene terephthalate photographic film base which was subcoated with vinylidene chloride/methyl acrylate/itaconic acid as disclosed in Alles et al. U.S. Patent 2,627,088. The photopolymerizable coating was allowed to dry for 2 days in the dark at room temperature. A 2-mil thick photopolymerizable film on the support was obtained. The dry, coated surface was brought into contact with a 1-mil thick cellophane film and passed through pressure rollers at 60° C. to laminate the cover film to the photopolymerizable layer. The laminated element was brought into contact with the emulsion side of a photographic transparency and then placed in a printing frame. The printing frame containing the thermoplastic photopolymerizable element and the negative was placed beneath a 1800-watt, high-pressure mercury-arc lamp and the coating exposed through the negative to 1.75 watts of actinic radiation per square inch for 5 seconds.

A 1-mil thick polyethylene terephthalate film support was skim-coated to a dry thickness of 0.5 mil with a colloidal carbon dispersion prepared from a carbon-water dispersion (50 percent by weight carbon of 73 mμ particle size), low viscosity polyethylene oxide (molecular weight of 100,000) (6 percent by weight based on the weight of carbon) and ethanol to reduce the carbon to 10 percent by weight of the dispersion. The regenerated cellulose cover film was stripped from the above-described exposed element. The dry carbon surface was then brought into intimate contact with the exposed photopolymerized surface and the sandwich heated by rapidly passing a hot iron, preheated to 72° C., over the back surface of the polyethylene terephthalate film supporting the colloidal carbon coating. After allowing the two surfaces to cool for 10 seconds they were separated. The carbon transferred to the unexposed thermoplastic areas on the polyethylene terephthalate photographic film base support forming a positive image on the support. A negative image remained on the carbon support. Both images had high contrast and fidelity. The positive image on the polyethylene terephthalate support was brought into contact with a paper support and the element formed was heated through the polyethylene terephthalate photographic film base support by means of a flat, hot surface at a temperature of about 150° C. for about 3 seconds. A duplicate positive copy of the original transparency was obtained on the paper support as the result of the transfer of the carbon and unexposed thermoplastic material to the paper support. Up to 5 copies were prepared by this heat transfer procedure using separate, receptor paper supports.

The exposure and subsequent operations were repeated except that the regenerated cellulose cover film was removed prior to exposure. In this case, the carbon transferred to the entire surface of the polymerizable layer so that no image could be detected.

*Example IX*

A photopolymerizable composition was prepared by mixing 15 g. of solution of polyethylene terephthalate/sebacate (50 mole percent) in methylene chloride (18 percent by weight solids), 2.7 g. of polyethylene glycol diacrylate (average molecular weight of 300), 0.003 g. of phenanthraquinone and 0.003 g. of p-methoxyphenol. The composition was coated to a solution depth of 10 mils on the surface of a 4-mil thick polyethylene terephthalate photographic film base support which was subcoated with vinylidene chloride/methyl acrylate/itaconic acid as disclosed in Alles et al., U.S. 2,627,088. After drying in the dark at room temperature, a 2.0-mil thick photopolymerizable film remained on the film base support.

Half of the dry coating was laminated to a 1-mil thick polyethylene terephthalate film by laying the film on the polymerizable layer and passing the sandwich so formed through rollers heated to 110° C. The laminated film was brought into contact with a line process photographic positive and then placed in a printing frame. The photopolymerizable element was placed beneath a 1800-watt, high pressure mercury-arc lamp and the surface exposed to 1.75 watts of actinic radiation per square inch for 3 seconds. The cover sheet was then removed. The element was placed, polyethylene terephthalate photographic film base support down, on the surface of a flat hot plate preheated to 120° C. After heating for 5 seconds, fine particles of zinc cadmium sulfide phosphor were sprinkled over the photopolymerized surface so that a fine film of powder covered the entire surface. The element was removed from the hot plate, was allowed to cool and the loose phosphor was brushed from the photopolymerized surface. The phosphor particles remained embedded in the areas of the photopolymerized layer which were not exposed to actinic radiation. The exposed areas of the photopolymerized layer did not contain any phosphor. The dusted image was brought into intimate contact with a paper support and the element formed was heated through its polyethylene terephthalate film base support at 150° C. for about 3 seconds by means of a preheated hot plate. A good copy of the original image was obtained on the paper support. Up to 5 copies were prepared by repeating the transfer procedure using separate paper supports. The images luminesced when exposed to ultraviolet light.

The unlaminated element was similarly exposed, and dusted with phosphor. In this case, however, the phosphor powder adhered to the entire surface so that a usable image was not obtained.

In the above example, after removal of the cover sheet, the exposed element was heated prior to application of finely divided solid particles. Alternatively, the element may be heated after application of the particles. Also, it has been found that there are some compositions of photopolymerizable strata which are sufficiently tacky at room temperature in the underexposed areas so as not to require heating.

*Example X*

Example IV was repeated except that the exposures were made reflectographically as follows: onto the light-sensitive side of the unlaminated element and onto the cover film of the laminated element were placed identical glossy, opaque, white papers with black printed messages, the message sides being toward the photopolymerizable surface. Each of the composites was placed in a standard photographic printing frame with the photopolymerizable element against the glass face of the printing frame. The assemblies were exposed reflectographically for 25 seconds to the radiation source described in Example IV. After the subsequent operations as described in Example IV, a right-reading positive copy of the message was obtained with the laminated element. Total transfer, and hence no image, was obtained with the unlaminated element.

The processes of the present invention are useful for a variety of copying, printing, decorative and manufacturing applications. Pigments, e.g., $TiO_2$, colloidal carbon, metal powders, phosphors, etc., and dyes which do not appreciably absorb light at the wave length being used for exposure or inhibit polymerization can be incorporated in the light-sensitive photopolymerizable layer, and by use of the instant process, image can be transferred to a receptor support. Multicopies of the process images can be obtained from the transferred image. The number of copies prepared is dependent on the photopolymerizable composition thickness as well as the process conditions. The process is also useful for preparing multicolor reproductions. Colorless constituents which form colored compounds when heat is applied or brought into contact with other color forming components are useful in the instant transfer process.

Lithographic surfaces can be produced by thermally transferring a hydrophobic layer to a hydrophilic receptor surface or vice versa. The images on the lithographic surface can be made impervious to chemical or solvent attack by post-exposing the lithographic surface. Alternatively, the exposed areas of the photopolymerizable composition, after the underexposed areas are transferred, can be used as a lithographic-offset printing plate if they are hydrophobic and the original sheet support is hydrophilic or vice versa. Silk screens can also be made by this process.

The transferred images are not only useful for making copies of the original image transparency by dry methods as indicated above but after transfer of the unexposed areas to a receptor support, the thermoplastic surface can be treated with, e.g., aqueous solutions, dyes, inks, etc., to form colored images. Colored copies of the original image can be obtained when the wet surface is brought into intimate contact with a receptor support and the surfaces separated. Solvents which are used for the spirit copying, e.g., ethanol, water, should meter out the dye used and be a non-solvent for the polymer, i.e., the solubility of the dye and binder are important factors in selecting the solvent. It is also possible to wet the photopolymerized surface, dry and then thermally transfer to obtain the colored copies. The process is also useful because it permits the rapid examination of the printing qualities, e.g., of separation negatives and positives, under conditions simulating true printing.

After exposure and removal of the cover sheet, the exposed photopolymerized stratum can be brought into intimate contact with a separate support, e.g., a roll of carbon or graphite; a roll coated with pigment dispersions; a roll which has a continuously replenished pigment or inked surface; a separate support coated with pigments with or without dyes, thermographic compounds, color forming compounds, hydrophilic and hydrophobic surfaces or a metallized film. Upon heating one or both surfaces to the operating temperature, the areas corresponding to the underexposed areas of the photopolymerized composition are transferred. A duplicate copy and a reverse copy are formed simultaneously. Multicopies of the duplicate copy can be made by bringing into intimate contact the surface of the duplicate copy and an image-receptive surface and applying the required amount of heat. The stripping procedure followed by the thermal transfer is useful in the preparation of silk screens. Printed circuits and electrically conducting matrices can be prepared by stripping up metallized films or metal powders.

The exposed photopolymerized elements are also useful with various dusting techniques, e.g., with finely divided dyes and pigments, the materials adhering in the underexposed areas. Multiple copies can be prepared. The dusted films are useful as filters, in the preparation of lithographic printing plates by using hydrophilic or hydrophobic materials, in the manufacture of printed circuits and electrically conducting or photoconductive matrices, in the preparation of two and multicolor reproductions and phosphor and ceramic patterns.

The advantages of this invention are the result of the simple procedure of placing a removable cover sheet on the light-sensitive stratum of a photopolymerizable element so that the cover sheet is present at least during the exposure. By using a cover sheet, the concentration of atmospheric oxygen in contact with the surface of the photopolymerizable stratum at the time of imagewise exposure is materially reduced. The photopolymerizable element therefore has an increased sensitivity or speed to the actinic radiation, exhibits increased contrast and also exhibits an increase in the degree of polymerization, resulting in an increase in the difference of stick temperatures between the exposed and underexposed areas. An additional advantage is that the tendency for "Reciprocity Law" failure is reduced.

As practical results of these advantages it is possible to eliminate the necessity of exposure in vacuum printing frames, to use simple and economical low intensity exposure sources, to make satisfactory reproduction of low contrast original images or to make copies by reflex exposure (which has the effect of reducing contrast), and to permit less stringent control of the temperature of the thermal development processes.

Still another advantage resulting from the reduced oxygen inhibition is the elimination of the surface effect whereby a thin surface layer tends to remain completely unpolymerized after exposure. In the case of transfer of an image to an image-receptive surface, this surface effect can cause a "stain" or a slight undesired transfer of material from the exposed areas.

Still further advantages will be apparent to those skilled in the art of image formation.

What is claimed is:

1. In a process for reproducing an image from a photopolymerizable element comprising a support bearing a stratum of a photopolymerizable composition solid below 40° C., said stratum being thermally transferrable by having a stick temperature above 40° C. and below 220° C. and comprising (*a*) a thermoplastic polymeric compound solid at 50° C., (*b*) a non-gaseous ethylenically unsaturated compound containing at least one terminal ethylenic group, having a boiling point above 100° C. at normal atmospheric pressure, being capable of forming a high polymer by free-radical initiated, chain-propagating addition polymerization and having a plasticizing action on said thermoplastic polymer, said constituents (*a*) and (*b*) being present in amounts from 3 to 97 and 97 to 3 parts by weight, respectively, including exposing said photopolymerizable element imagewise to actinic radiation until polymerization and an increase in said stick temperature of said unsaturated compound takes place in the exposed image areas without substantial polymerization and an increase in stick temperature in the underexposed, complementary, adjoining coplanar image areas, bringing the surface of the exposed stratum into contact with the surface of an image-receptive support, heating at least one of the contacting surfaces to an operating temperature intermediate between the stick temperatures of the exposed and underexposed areas and separating the two surfaces whereby an image corresponding to the underexposed image areas is transferred to the surface of the image-receptive support, the improvement characterized by having in intimate contact with said photopolymerizable stratum, at least during exposure, a removable cover sheet capable of uniformly transmitting actinic radiation and having a low permeability to oxygen, exposing said assembled cover sheet and stratum at atmospheric conditions and removing the cover sheet after exposure and prior to transfer of the underexposed image areas to the surface of the image-receptive support.

2. A process as defined in claim 1 wherein said removable cover sheet is polyethylene terephthalate.

3. A process as defined in claim 1 wherein the steps of contacting, heating and separating are repeated at least two times, each successive repetition being conducted with a different image-receptive support.

4. A process as defined in claim 1 wherein said ethylenically unsaturated compound is a diacrylate of a diol of the formula $HO(CH_2CH_2O)_nH$ where $n$ is an integer from 1 to 20.

5. A process as defined in claim 1 wherein said photopolymerizable composition contains 0.001 to 10 parts by weight per 100 parts by weight of constituents (*a*) and (*b*) of a free-radical generating addition polymerization initiator activatable by actinic radiation.

6. A process as defined in claim 5 wherein said photopolymerizable composition contains 0.001 to 2.0 parts by weight per 100 parts by weight of constituents (*a*) and (*b*) of a thermal addition polymerization inhibitor.

7. A process for reproducing an image from a photopolymerizable element which comprises exposing with actinic radiation, imagewise, said photopolymerizable element bearing a stratum of a photopolymerizable composition and in intimate contact with said stratum, at least during the exposure, a removable cover sheet capable of uniformly transmitting actinic radiation and having low permeability to oxygen, said stratum being solid below 40° C., being thermally transferrable by having a stick temperature above 40° C. and below 220° C. and comprising (*a*) a thermoplastic polymeric compound solid at 50° C., (*b*) a non-gaseous ethylenically unsaturated compound containing at least one terminal ethylenic group, having a boiling point above 100° C. at normal atmospheric pressure, being capable of forming a high polymer by free-radical iitiated, chain-propagating addition polymerization and having a plasticizing action on said thermoplastic compound and (*c*) at least 0.001 part per 100 parts by weight of components (*a*) and (*b*) of a free-radical generating polymerization initiator activatable by actinic radiation, said constitutents (*a*) and (*b*) being present in amounts from 3 to 97 and 97 to 3 parts by weight, respectively, until polymerization with an accompanying increase in said stick temperature of said unsaturated compound occurs in the exposed image areas without substantial polymerization and an increase in stick temperature in the underexposed, complementary, adjoining coplanar image areas, removing the cover sheet, applying finely divided solid particles of material to the resulting surface of said element, whereby the particles are preferentially adhered to the underexposed areas, removing the particles in the exposed areas, contacting the surface of the layer having finely divided particles adherent thereto with the surface of an image-receptive support while maintaining said layer at an operating temperature intermediate between the stick temperatures of the underexposed and exposed areas, and separating the image-receptive support from said layer whereby said particles and adherent portion of the underexposed image areas transfer to the surface of the image-receptive support.

8. A process for reproducing an image from a photopolymerizable element which comprises exposing with actinic radiation, imagewise, said photopolymerizable element bearing a stratum of a photopolymerizable composition and in intimate contact with said stratum at least during the exposure a removable cover sheet capable of uniformly transmitting actinic radiation and having low permeability to oxygen, said stratum being solid below 40° C., being thermally transferrable by having a stick temperature above 40° C. and below 220° C. and comprising (*a*) a thermoplastic polymeric compound solid at 50° C., (*b*) a non-gaseous ethylenically unsaturated compound containing at least one terminal ethylenic group, having a boiling point above 100° C. at normal atmospheric pressure, being capable of forming a high polymer by free-radical initiated, chain-propagating addition polymerization and having a plasticizing action on said thermoplastic compound and (*c*) at least 0.001 part by weight per 100 parts by weight of constituents (*a*) and (*b*) of a free-radical generating addition polymerization initiator activatable by actinic radiation, said constituents (*a*) and (*b*) being present in amounts from 3 to 97 and 97 to 3 parts by weight, respectively, until polymerization with an accompanying increase in said stick temperature of said unsaturated compound occurs in the exposed image areas without substantial polymerization and an increase in stick temperature in the underexposed, complementary, adjoining coplanar image areas, removing the cover sheet, placing a layer of finely divided discrete particles of material which are solid at least at the operating temperature and are loosely bound in said layer into contact with the resulting exposed surface of said element, and maintaining said surfaces in contact while maintaining at least one of said surfaces at an operating temperature intermediate between the stick temperatures of the underexposed and exposed areas, and separating said surfaces whereby said particles are transferred to the surface of the resulting exposed element in the areas corresponding to the underexposed image areas.

References Cited in the file of this patent

UNITED STATES PATENTS

| | | |
|---|---|---|
| 2,073,033 | Szasz | Mar. 9, 1937 |
| 2,704,712 | Jackson | Mar. 22, 1955 |
| 2,760,863 | Plambeck | Aug. 28, 1956 |
| 2,948,611 | Barney | Aug. 9, 1960 |